(12) United States Patent
Graham et al.

(10) Patent No.: US 6,270,647 B1
(45) Date of Patent: Aug. 7, 2001

(54) ELECTROPLATING SYSTEM HAVING AUXILIARY ELECTRODE EXTERIOR TO MAIN REACTOR CHAMBER FOR CONTACT CLEANING OPERATIONS

(75) Inventors: Lyndon W. Graham; Kyle Hanson; Thomas L. Ritzdorf; Jeffrey I. Turner, all of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/387,338

(22) Filed: Aug. 31, 1999

Related U.S. Application Data

(63) Continuation of application No. PCT/US98/00126, filed on Jan. 6, 1998, which is a continuation-in-part of application No. 08/940,670, filed on Sep. 30, 1997, and a continuation-in-part of application No. 08/940,930, filed on Sep. 30, 1997, now Pat. No. 6,099,712.

(51) Int. Cl.$^7$ .................................................. C25D 21/00
(52) U.S. Cl. ..................... 205/99; 204/224 R; 204/276; 204/286.1; 204/288.1; 204/297.06; 205/123; 205/223
(58) Field of Search ..................... 205/123, 143, 205/157, 223, 80, 99; 204/224 R, 285, 287, 297.01, 297.06, 276, 286.1, 288.1

(56) References Cited

U.S. PATENT DOCUMENTS

| | | |
|---|---|---|
| 3,616,284 | 10/1971 | Bodmer et al. . |
| 4,304,641 | 12/1981 | Grandia et al. . |
| 4,323,433 | 4/1982 | Loch . |
| 4,378,283 | 3/1983 | Seyffert et al. . |
| 4,391,694 | 7/1983 | Runsten . |
| 4,466,864 * | 8/1984 | Bacon et al. ........................ 205/105 |
| 4,906,341 | 3/1990 | Yamakawa et al. . |
| 5,000,827 | 3/1991 | Schuster et al. . |
| 5,078,852 * | 1/1992 | Yee et al. ........................ 204/297.05 |
| 5,168,887 | 12/1992 | Thompson et al. . |

(List continued on next page.)

FOREIGN PATENT DOCUMENTS

US WO99/
16936      4/1999   (WO) .

OTHER PUBLICATIONS

US application No. 09/940,670, Graham et al. filed Sep. 30, 1997.
F.A. Lowenheim, Electroplating, McGraw–Hill Book Co., New York, pp. 78–79, 1978.*

*Primary Examiner*—Bruce F. Bell
*Assistant Examiner*—William T. Leader
(74) *Attorney, Agent, or Firm*—Perkins Coie LLP

(57) ABSTRACT

A system for electroplating a semiconductor wafer is set forth. The system comprises a first electrode in electrical contact with the semiconductor wafer and a second electrode. The first electrode and the semiconductor wafer form a cathode during electroplating of the semiconductor wafer. The second electrode forms an anode during electroplating of the semiconductor wafer. A reaction container defining a reaction chamber is also employed. The reaction chamber comprises an electrically conductive plating solution. At least a portion of each of the first electrode, the second electrode, and the semiconductor wafer contact the plating solution during electroplating of the semiconductor wafer. An auxiliary electrode is disposed exterior to the reaction chamber and positioned for contact with plating solution exiting the reaction chamber during cleaning of the first electrode to thereby provide an electrically conductive path between the auxiliary electrode and the first electrode. A power supply system is connected to supply plating power to the first and second electrodes during electroplating of the semiconductor wafer and is further connected to render the first electrode an anode and the auxiliary electrode a cathode during cleaning of the first electrode.

15 Claims, 10 Drawing Sheets

U.S. PATENT DOCUMENTS

| | | |
|---|---|---|
| 5,228,966 | 7/1993 | Murata . |
| 5,391,285 | 2/1995 | Lytle et al. . |
| 5,429,733 | 7/1995 | Ishida . |
| 5,437,777 | 8/1995 | Kishi . |
| 5,662,788 | 9/1997 | Sandhu et al. . |
| 5,670,034 | 9/1997 | Lowery . |
| 6,099,712 | 8/2000 | Ritzdorf et al. . |
| 6,174,425 * | 1/2001 | Simpson et al. ........................ 205/96 |

* cited by examiner

Fig. 5A
Fig. 5B
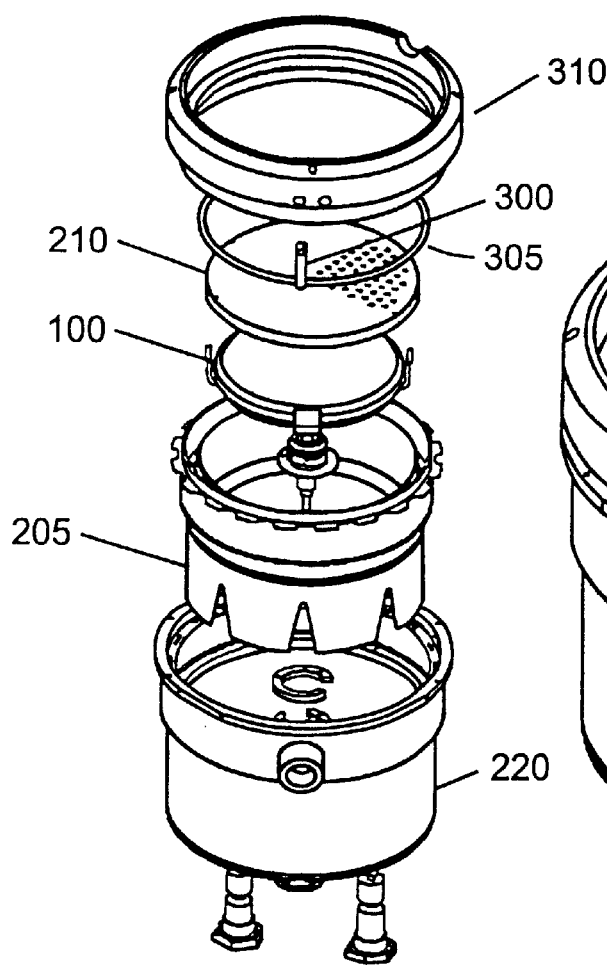
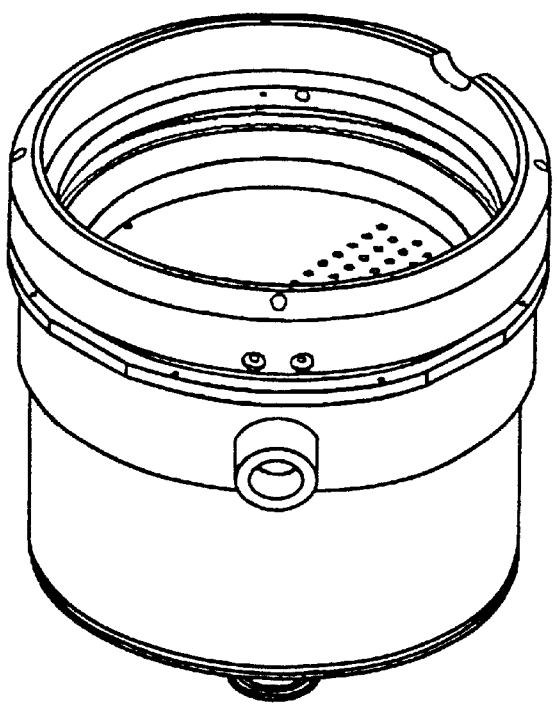

ELECTROPLATING SYSTEM HAVING AUXILIARY ELECTRODE EXTERIOR TO MAIN REACTOR CHAMBER FOR CONTACT CLEANING OPERATIONS

CROSS-REFERENCE TO RELATED APPLICATIONS

This is a continuation application of International PCT Patent Application No. PCT/US98/00126 designating the US, filed Jan. 6, 1998, entitled ELECTROPLATING SYSTEM HAVING AUXILIARY ELECTRODE EXTERIOR TO MAIN REACTOR CHAMBER FOR CONTACT CLEANING OPERATIONS, which is a continuation in-part from U.S. patent application Ser. No. 08/940,670, filed Sep. 30, 1997, and U.S. patent application Ser. No. 08/940,930, filed Sep. 30, 1997, now U.S. Pat. No. 6,099,712.

STATEMENT REGARDING FEDERALLY SPONSORED RESEARCH OR DEVELOPMENT

Not Applicable

BACKGROUND OF THE INVENTION

In the production of semiconductor integrated circuits and other semiconductor articles from semiconductor wafers, it is often necessary to provide multiple metal layers on the wafer to serve as interconnect metallization which electrically connects the various devices on the integrated circuit to one another. Traditionally, aluminum has been used for such interconnects, however, it is now recognized that copper metallization may be preferable.

The application of copper onto semiconductor wafers has, in particular, proven to be a great technical challenge. At this time copper metallization has not fully achieved commercial reality due to practical problems of forming copper layers on semiconductor devices in a reliable and cost efficient manner.

The industry has sought to plate copper onto a semiconductor wafer by using a damascene electroplating process where holes, more commonly called vias, trenches and other recesses are used in which the pattern of copper is desired. In the damascene process, the wafer is first provided with a metallic seed layer which is used to conduct electrical current during a subsequent metal electroplating step. The seed layer is a very thin layer of metal which can be applied using one or more of several processes. For example, the seed layer of metal can be laid down using physical vapor deposition or chemical vapor deposition processes to produce a layer on the order of 1000 angstroms thick. The seed layer can advantageously be formed of copper, gold, nickel, palladium, and most or all other metals. The seed layer is formed over a surface which is convoluted by the presence of the vias, trenches, or other device features which are recessed.

In damascene processes, the copper layer that is electroplated onto the seed layer is in the form of a blanket layer. The blanket layer is plated to an extent which forms an overlying layer, with the goal of completely providing a copper layer that fills the trenches and vias and extends a certain amount above these features. Such a blanket layer will typically be formed in thicknesses on the order of 10,000–15,000 angstroms (1–1.5 microns).

After the blanket layer has been electroplated onto the semiconductor wafer, excess metal material present outside of the vias, trenches or other recesses is removed. The metal is removed to provide a resulting patterned metal layer in the semiconductor integrated circuit being formed. The excess plated material can be removed, for example, using chemical mechanical planarization. Chemical mechanical planarization is a processing step which uses the combined action of a chemical removal agent and an abrasive which grind and polish the exposed metal surface to remove undesired parts of the metal layer applied in the electroplating step.

Automation of the copper electroplating process has been elusive, and there is a need in the art for improved semiconductor plating systems which can produce copper layers upon semiconductor articles which are uniform and can be produced in an efficient and cost-effective manner. More particularly, there is a substantial need to provide a copper plating system that is effectively and reliably automated.

In the electroplating of semiconductor wafers, an anode electrode is disposed in a plating bath and the wafer with the seed layer thereon is used as a cathode with the face of the wafer that is to be plated contacting an upper surface of the plating bath. The semiconductor wafer is held by a support system that also provides be requisite cathode potential to the wafer. The support system may comprise conductive fingers that secure the wafer in place and also contact the wafer in order to conduct electrical current for the plating operation.

During the electroplating process, the conductive fingers as well as be semiconductor wafer are plated with the plating metal, such as copper. One potential problem that occurs in such a process is the build up of plating metal deposits on the conductive finger. These deposits may: 1) result in unintended attachment of the conductive finger while in contact with the wafer such that upon disengagement of the conductive finger with the wafer surface, some of the plated surface may tear away and fall off as particles; 2) introduce variability in the current being conducted through the contact and ultimately across the plated surface; and 3) result in small particles breaking off of the deposits on the conductive finger or off of the wafer which may enter the plating bath, and ultimately lodge directly on the wafer surface during plating or contaminate subsequently plated wafers. These effects may each independently or in combination create irregularities in the plated surface or result in other defects in the wafer. Additionally, these effects may also contribute to reduced wafer to wafer uniformity.

One manner in which the plating may be removed from the electrode fingers is to manually remove the conductive electrode fingers for cleaning when a specified level of plating or deposits has built-up on the finger contact surface. This is undesirable, however, because it causes significant down time in the electroplating processing, particularly in continuous wafer plating operations. Significant loss of wafer throughput and higher processing costs are associated with this course of action. It would be more desirable to develop a method for cleaning the deposits off of the electrode and segregating the resulting particles from the plating process while at the same time minimizing the downtime of the production process.

BRIEF SUMMARY OF THE INVENTION

A system for electroplating a semiconductor wafer is set forth. The system comprises a first electrode in electrical contact with the semiconductor wafer and a second electrode. The first electrode and the semiconductor wafer form a cathode during electroplating of the semiconductor wafer. The second electrode forms an anode during electroplating of the semiconductor wafer. A reaction container defining a reaction chamber is also employed. The reaction chamber comprises an electrically conductive plating solution. At least a portion of each of the first electrode, the second electrode, and the semiconductor wafer contact the plating solution during electroplating of the semiconductor wafer. An auxiliary electrode is disposed exterior to the reaction chamber and positioned for contact with plating solution exiting the reaction chamber during cleaning of the first electrode to thereby provide an electrically conductive path between the auxiliary electrode and the first electrode. A power supply system is connected to supply plating power to the first and second electrodes during electroplating of the semiconductor wafer and is further connected to render the first electrode an anode and the auxiliary electrode a cathode during cleaning of the first electrode.

BRIEF DESCRIPTION OF THE SEVERAL VIEWS OF THE DRAWINGS

FIGS. 5A, 5B and 5C illustrate a process bowl assembly that may be used to implement the embodiment of the invention illustrated in FIG. 4.

DETAILED DESCRIPTION OF THE INVENTION

Figure 1:
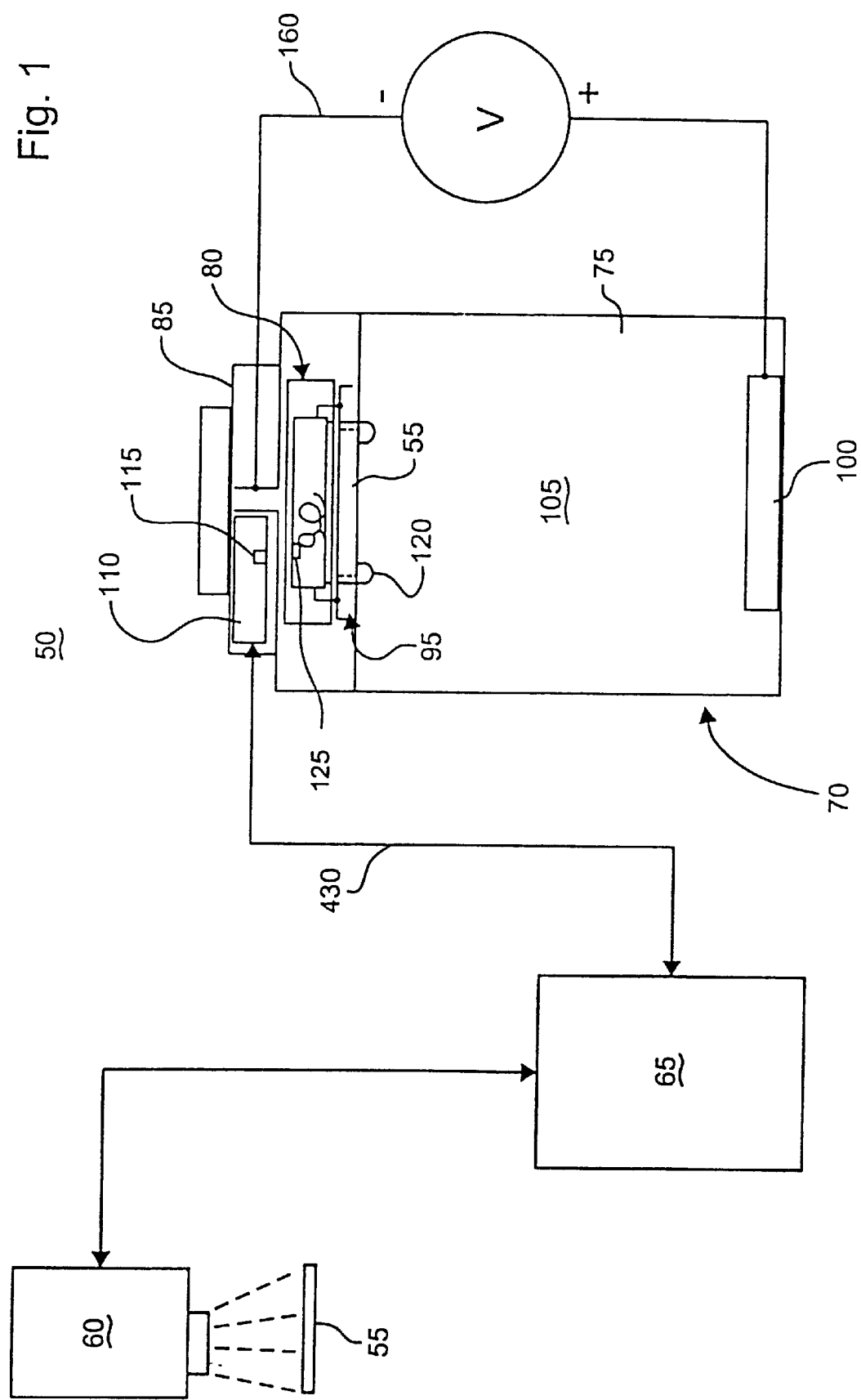
FIG. 1 is a schematic block diagram of an electroplating system that may use an auxiliary electrode in accordance with the present invention.

FIG. 1 is a schematic block diagram of a plating system, shown generally at 50, for electroplating a metallization layer, such as a patterned copper metallization layer, on, for example, a semiconductor wafer 55. The illustrated system generally comprises a vision system 60 that communicates with a main electroplating control system 65. The vision system 60 is used to identify the particular product being formed on the semiconductor wafer 55 before it is placed into an electroplating apparatus 70. With the information provided by the vision system 60, the main electroplating control system 65 may set the various parameters that are to be used in the electroplating apparatus 70 to electroplate the metallization layer on the wafer 55.

In the illustrated system, the electroplating apparatus 70 is generally comprised of an electroplating chamber 75, a rotor assembly 80, and a stator assembly 85. The rotor assembly 80 supports the semiconductor wafer 55, a current control system 90, and a current thief assembly 95. The rotor assembly 80, current control system 90, and current thief assembly 95 are disposed for co-rotation with respect to the stator assembly 85. The chamber 75 houses an anode assembly 100 and contains the solution 105 used to electroplate the semiconductor wafer 55.

The stator assembly 85 supports the rotor assembly 80 and it's associated components. A stator control system 110 may be disposed in fixed relationship with the stator assembly 85. The stator control system 110 may be in communication with the main electroplating control system 65 and may receive information relating to the identification of the particular type of semiconductor device that is being fabricated on the semiconductor wafer 55. The stator control system 110 further includes an electromagnetic radiation communications link 115 that is preferably used to communicate information to a corresponding electromagnetic radiation communications link 125 of the current control system 90 used by the current control system 90 to control current flow (and thus current density) at individual portions of the current thief assembly 95. A specific construction of the current thief assembly 95, the rotor assembly 80, the stator control system 110, and the current control system 90 is set forth in further detail below.

In operation, contacts 120 make electrical contact with the semiconductor wafer 55. The semiconductor wafer 55 is then lowered into the solution 105 in minute steps by, for example, a stepper motor or the like until the lower surface of the semiconductor wafer 55 makes initial contact with the solution 105. Such initial contact may be sensed by, for example, detecting a current flow through the solution 105 as measured through the semiconductor wafer 55. Such detection may be implemented by the stator control system 110, the main electroplating control system 65, or the current control system 90. Preferably, however, the detection is implemented with the stator control system 110.

Once initial contact is made between the surface of the solution 105 and the lower surface of the semiconductor wafer 55, the wafer 55 is preferably raised from the solution 105 by a small distance. The surface tension of the solution 105 creates a meniscus that contacts the lower surface of the semiconductor wafer 55 that is to be plated. By using the properties of the meniscus, plating of the side portions of the wafer 55 is inhibited.

Once the desired meniscus has been formed at the plating surface, electroplating of the wafer may begin. Specific details of the actual electroplating operation are not particularly pertinent to the use or design of present invention and are accordingly omitted.

Figure 2:
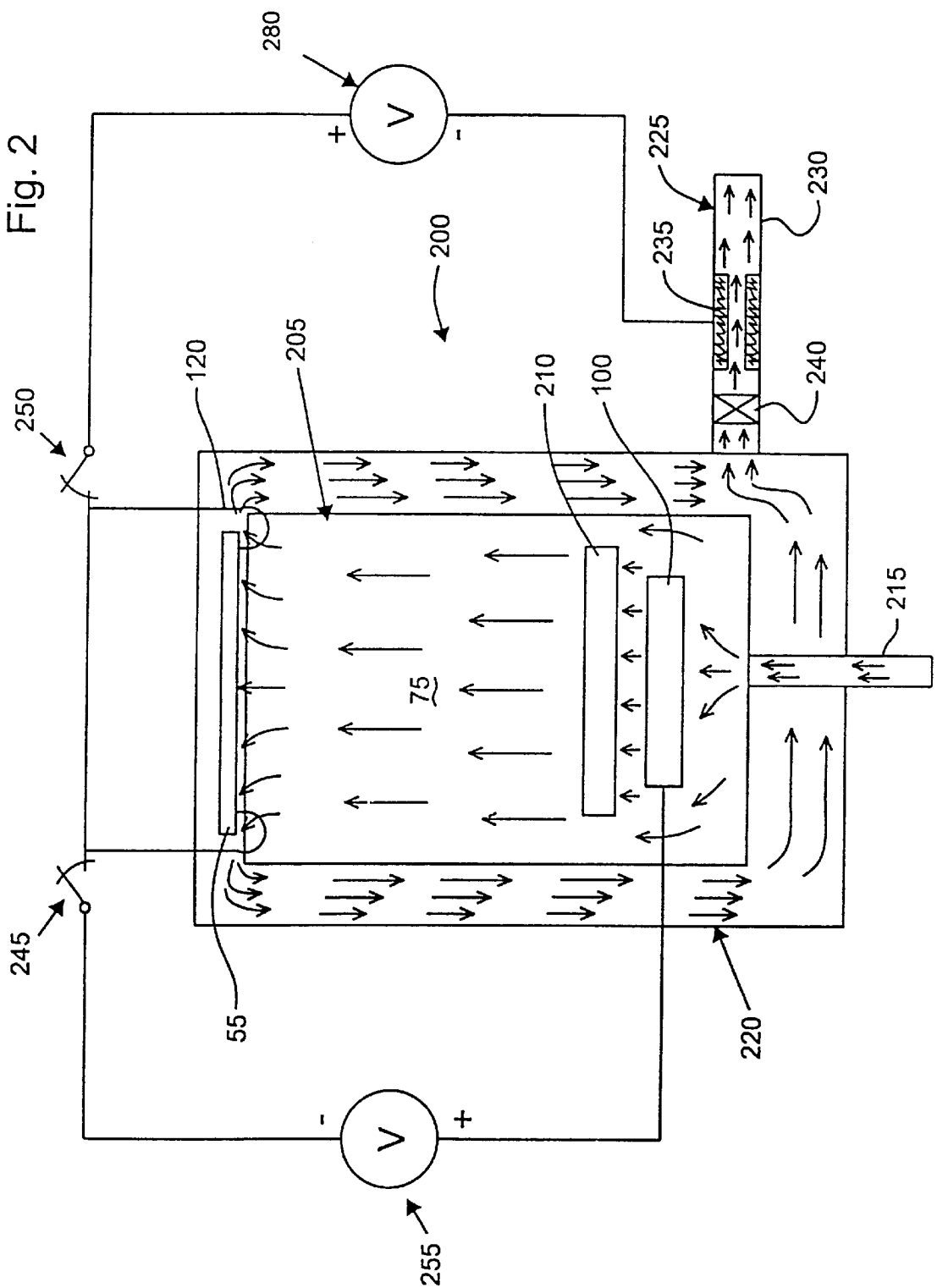
FIG. 2 is a schematic block diagram of one embodiment of the invention comprising an auxiliary electrode in a fluid outlet tube.

FIG. 2 illustrates one embodiment of a semiconductor wafer electroplating system that facilitates in-situ cleaning of the contacts 120. As illustrated, the system, shown generally at 200, includes a reactor cup 205 that defines the processing chamber 75. The anode 100 is disposed at the bottom of the reactor cup 205 while the semiconductor wafer 55 functioning as the cathode is disposed at the upper portion of the reactor cup 205. As noted above, the wafer 55 is supported so that only the bottom face thereof is in contact with the plating solution. Optionally, a diffuser assembly 210 is disposed between the anode 100 and the semiconductor wafer 55.

Plating solution is supplied to the processing chamber 75 through a fluid inlet 215 that opens to the bottom of lever processing cup 205 the plating fluid fills chamber 75 and provides a conductive path between the anode 100 and the semiconductor wafer 55 to thereby form a complete electroplating circuit. A continuous flow of the plating fluid into the chamber 75 is preferable. As such, processing solution must the removed from the processing chamber 75 at the same rate that it is supplied through the inlet 215. To this end, the processing cup 205 is disposed within a reservoir bowl 220. Plating solution fills chamber 75 through inlet 215 and overflows from the reactor cup 205. The overflowing fluid flows over the upper rim of cup 205 and into the interstitial region between the outer perimeter of cup 205 and he inner perimeter of reservoir bowl 220. Processing solution is allowed to exit from the reservoir bowl 220 through a fluid outlet assembly 225. The fluid outlet assembly 225 is preferably comprised of an outlet to 230, an external electrode 235, and a control valve 240 disposed in the fluid path between the reservoir bowl 220 and the external electrode 235.

During normal wafer plating operations, switch for 245 is closed while switch 250 is open. This allows the supply 255 to provide the requisite plating power to execute a plating operation of the semiconductor wafer 55.

After the electroplating process is completed, the semiconductor wafer 55 is removed and in-situ cleaning of the contact electrodes 120 may be conducted. To this end, switch 245 is opened while switch 250 is closed to thereby connect supply 280 to the contact electrodes 120 and the external electrode 235. This effectively makes the electrode contacts 120 function as anodes and the external electrode 235 function as the cathode. Processing fluid flow from reservoir bowl 220 is controlled by control valve 240 to maintain a level of the processing fluid in the reservoir bowl 220 at a level which maintains electrical contact through the plating solution between the electrodes 120 and external electrode 235. The resulting reverse current may be provided at a voltage potential in the approximate range of 0.1–100 volts, alternatively in the approximate range of 0.1–20 volts, or alternatively in the approximate range of 1–10 volts between the auxilliary electrode and the wafer contact electrodes. The voltage potential may vary dependent on the number of semiconductor workpieces that are processed through a normal operating cycle, etc.

It should be noted that the two supply configuration illustrated here is merely for illustrative purposes. A single supply capable of providing both the plating and cleaning power may be used with any suitable switching configuration.

With supply 280 connected, metal, such as copper, that was plated to the electrodes 120 during electroplating above the wafer 55 may be partially or completely removed. Since this plating operation takes place in an electrical circuit exterior to the processing chamber 75, any by-products resulting from the cleaning operation fall exterior to the chamber 75 thereby maintaining the chamber in a relatively hygienic state.

The foregoing cleaning operations may take place at various times. For example, the cleaning operation may occur after electroplating a single semiconductor wafer, five semiconductor wafers, ten semiconductor wafers, etc, during the manufacturing process. If a small number of wafers is chosen, such cleaning may occur without disrupting manufacturing operations. Generally, however, when more than 50 semiconductor wafers have been processed, the duration of the cleaning operation may become excessive thereby prohibiting such cleaning operations from taking place during typical semiconductor wafer manufacturing operations. It will be recognized that the amount of copper plated on each wafer between cleaning cycles will effectively determined how much copper is plated onto the contact electrodes 120 and thereby determine the duration of the in-situ cleaning operation.

Removed deposits may flow out the plating bath via the outlet tube 230 and be collected in a particulate filter or disposed in an appropriate waste removal and handling operation. If passed through a particulate filter, the filtered solution may be reintroduced into the plating bath. This is desirable from both economic and waste handling perspectives.

If a particulate filter is used, it may comprise any material that is capable of filtering or trapping particles, particularly those comprising deposits removed from the cleaned electrode contacts. The particulate filter ideally also allows passage of ions along with the plating bath solution passing through it. In this case, the filtered plating bath solution may be reintroduced into the plating bath with the associated benefits described above. Materials suitable for use in the particulate filter include those such as fritted glass.

Figure 3:
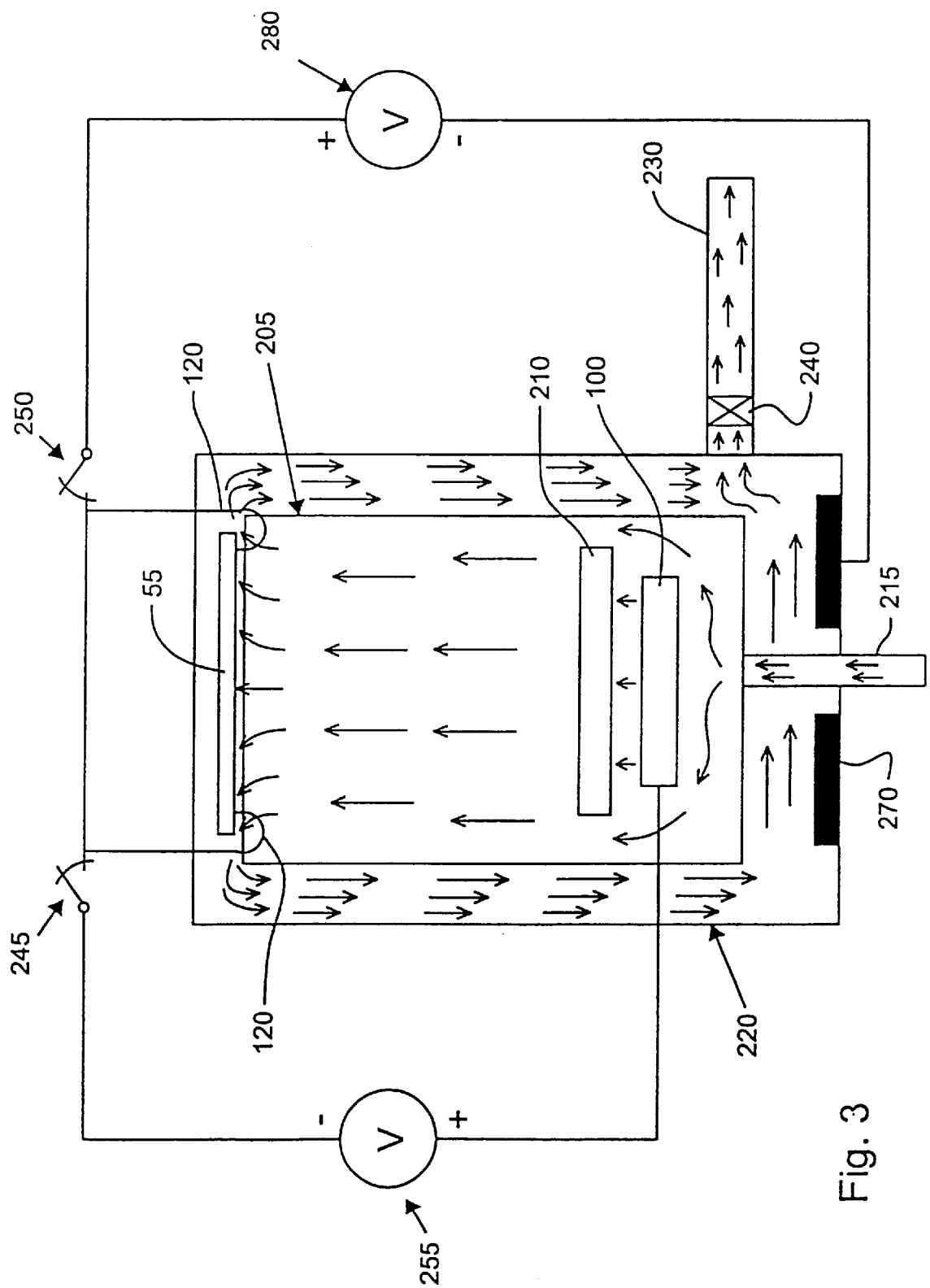
FIG. 3 is a schematic block diagram of one embodiment of the invention comprising an auxiliary electrode in a reservoir container exterior to the reaction chamber.

An alternative placement of an external electrode for in-situ cleaning is illustrated in FIG. 3. In this embodiment, the external electrode 270 is disposed at the bottom bottom of reservoir bowl 220 and is in the form all of an annular electrode disposed about the inlet tube 215.

Figure 4:
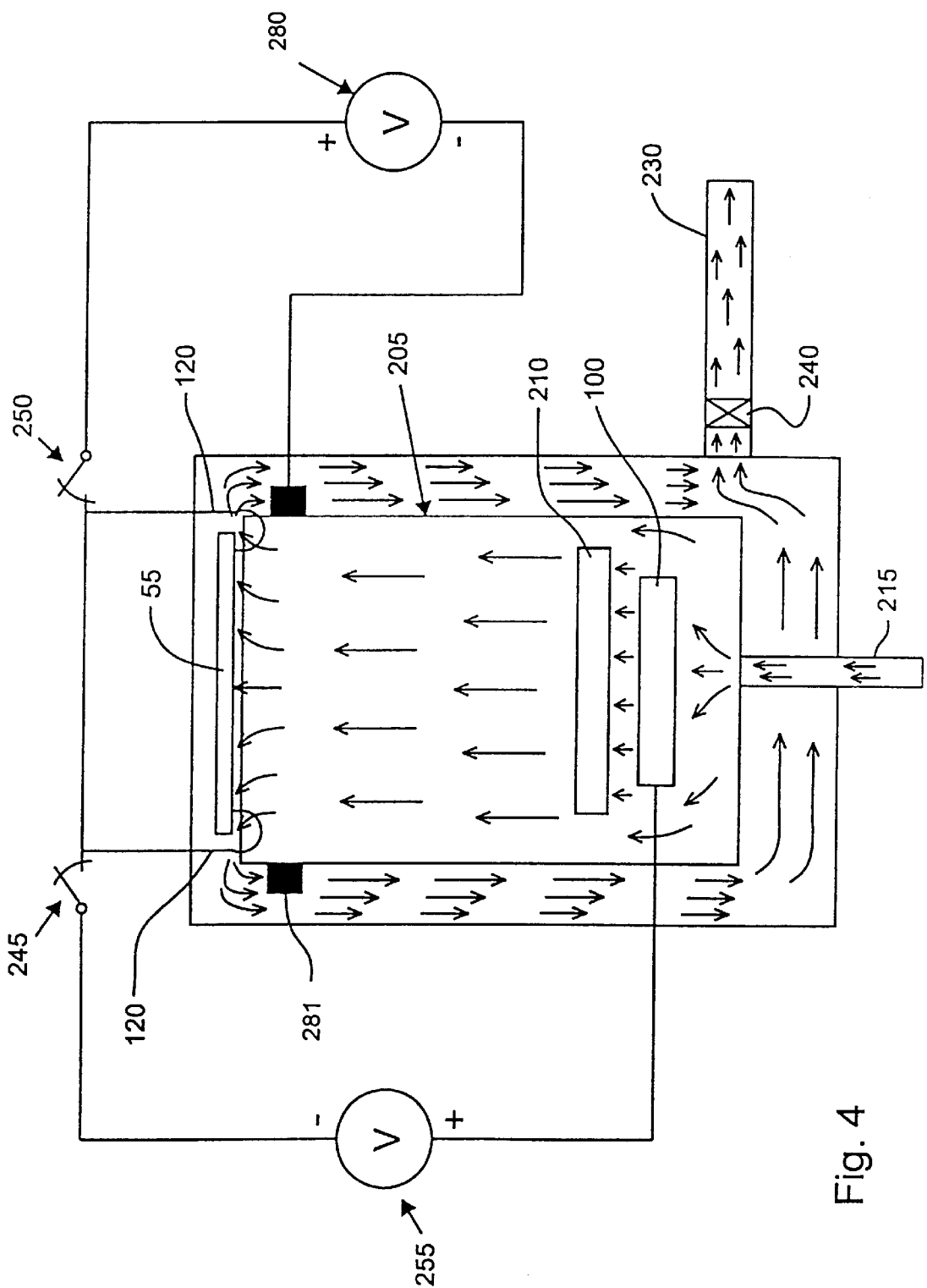
FIG. 4 is a schematic block diagram of one embodiment of the invention comprising an auxiliary electrode disposed about an upper exterior rim of the reaction cup.

A still further alternative placement of the external electrode is illustrated in FIG. 4. In the illustrated embodiment, the external electrode 281 is disposed about the outer upper periphery of the processing cup 205. Placement of the external electrode 281 at the outer upper periphery of the processing cup 205 increases the likelihood of a proper electrical connection through the fluid during cleaning operations. Additionally, since the external electrode 281 is disposed in a region having high velocity processing fluid flow, any residue particulates that may inhibit electrode cleaning operations may be wiped from the electrode 281 by the processing fluid.

In each of the embodiments illustrated in FIGS. 3 and 4, operation of the apparatus during electroplating and cleaning operations are substantially similar to those set forth in connection with the embodiment of FIG. 2.

The foregoing apparatus and associated methods are suitable for increasing the number of wafers produced in a specific time interval in an electroplating process as compared to systems without such a cleaning operation. Because the cleaning cycles can be invoked quickly and easily, in some instances within standard electroplating process operating sequences, the electrode contacts remain cleaner for longer periods of time as compared to electrodes without such cleaning. This allows for more wafers to be processed within the same quality parameters over the same period of time. Systems using such methods also increase wafer processing throughput by avoiding lengthy downtime associated with shutting down electroplating systems to manually replace/clean the conductive finger electrodes.

The apparatus and associated methods also enhance the uniformity of the surface plating compared to systems without such a cleaning operation. An electroplated surface, particularly on a semiconductor wafer, is ideally void of irregularities. The desired uniformity is, in part, a function of the current density across the wafer surface during electroplating. Clean contact between the conductive electrode contact surface and the wafer surface is critical to achieving uniformity. The cleaner electrode contacts consequently improve uniform current density on the wafer surface during electroplating, giving rise to improved surface uniformity across the wafer surface and provide greater wafer to wafer uniformity (that is, the quality of a wafer as compared to a subsequently plated wafer in the same process) compared to methods without such cleaning operations.

The use and placement of the auxiliary electrodes allows for the particles and contaminates in the plating bath solution to be segregated and removed from the reaction system, thus preventing the particles and contaminates from lodging onto subsequently processed wafers and thereby creating irregularities on those surfaces. The auxiliary electrode and filtering configuration also provides a convenient means for cleaning the finger electrode and plating solution with minimal intrusion into the reactor system as compared with manual replacement of the finger electrode.

Figure 5C:
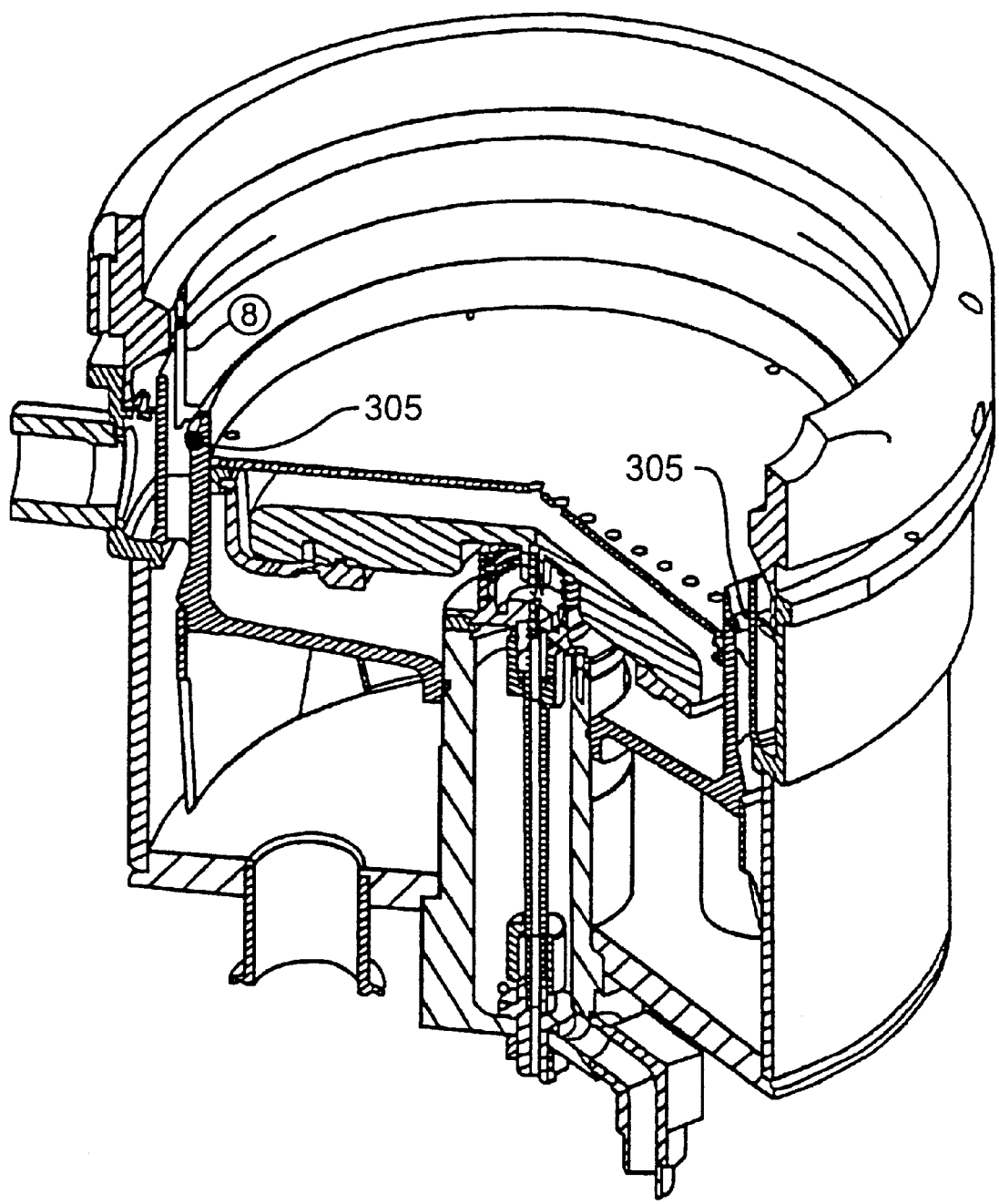

FIGS. 5A, 5B, and 5C illustrate a more particular embodiment of the apparatus shown in general form in FIG. 4. As illustrated, the apparatus includes an auxiliary electrode support 300 that supports electrode ring 305. The electrode ring 305 is positioned between a rim 310 and diffuser 210, which is positioned above anode assembly 100. The combined assemblies are positioned within processing cup weldment 205 which, in turn, is disposed in reservoir bowl weldment 220. The auxiliary electrode ring 305 is secured to support 300 such that the electrode ring 305 is below the plating solution meniscus and outside of the plating bath. In such position it is capable of contacting with overflow solution flowing from the bath.

In a further embodiment, the system described directly above may optionally comprise a particulate filter. The particulate filter may be positioned at any appropriate place that allows for the plating bath solution containing particulate matter to pass through it, such as in the space between the plating bath wall and the outer chamber wall or in an exit tube attached to that space. In such a configuration, the particulate filter comprises any material that is capable of filtering or trapping particles, particularly those comprising deposits removed from the cleaned electrode contacts. The particulate filter ideally also allows passage of ions along with the plating bath solution passing through it. In this case, the filtered plating bath solution may be reintroduced into the plating bath with the associated benefits described above. Materials suitable for use in the particulate filter include those such as fritted glass.

Various other reactor apparatus configurations are also suitable for use with one or more of the external electrode configurations discussed above. One such reactor is shown in FIGS. 6 and 7.

Figure 6:
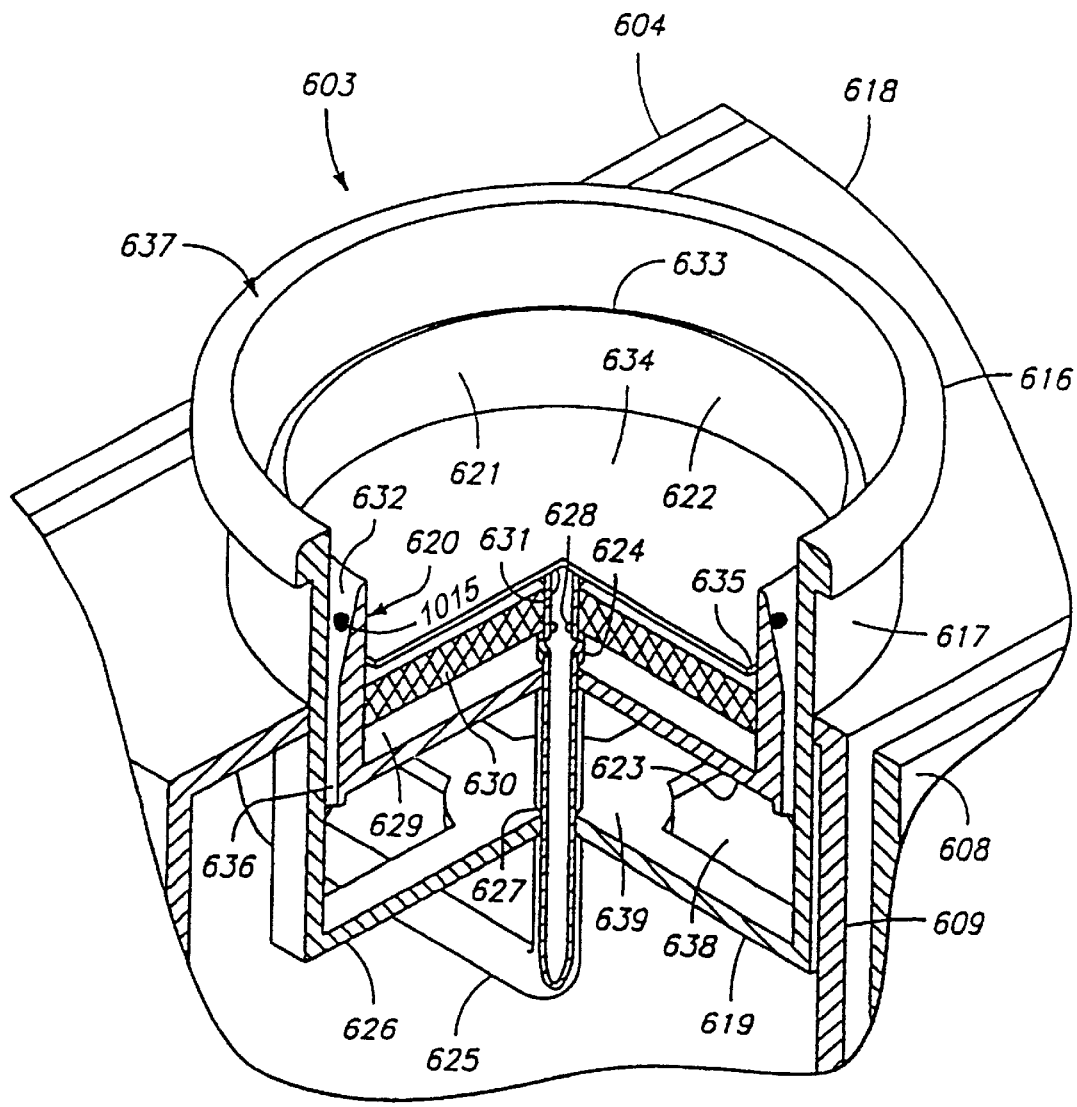
FIG. 6 illustrates a further embodiment of a process bowl assembly that may be used to implement the embodiment of the invention illustrated in FIG. 4.
Figure 7:
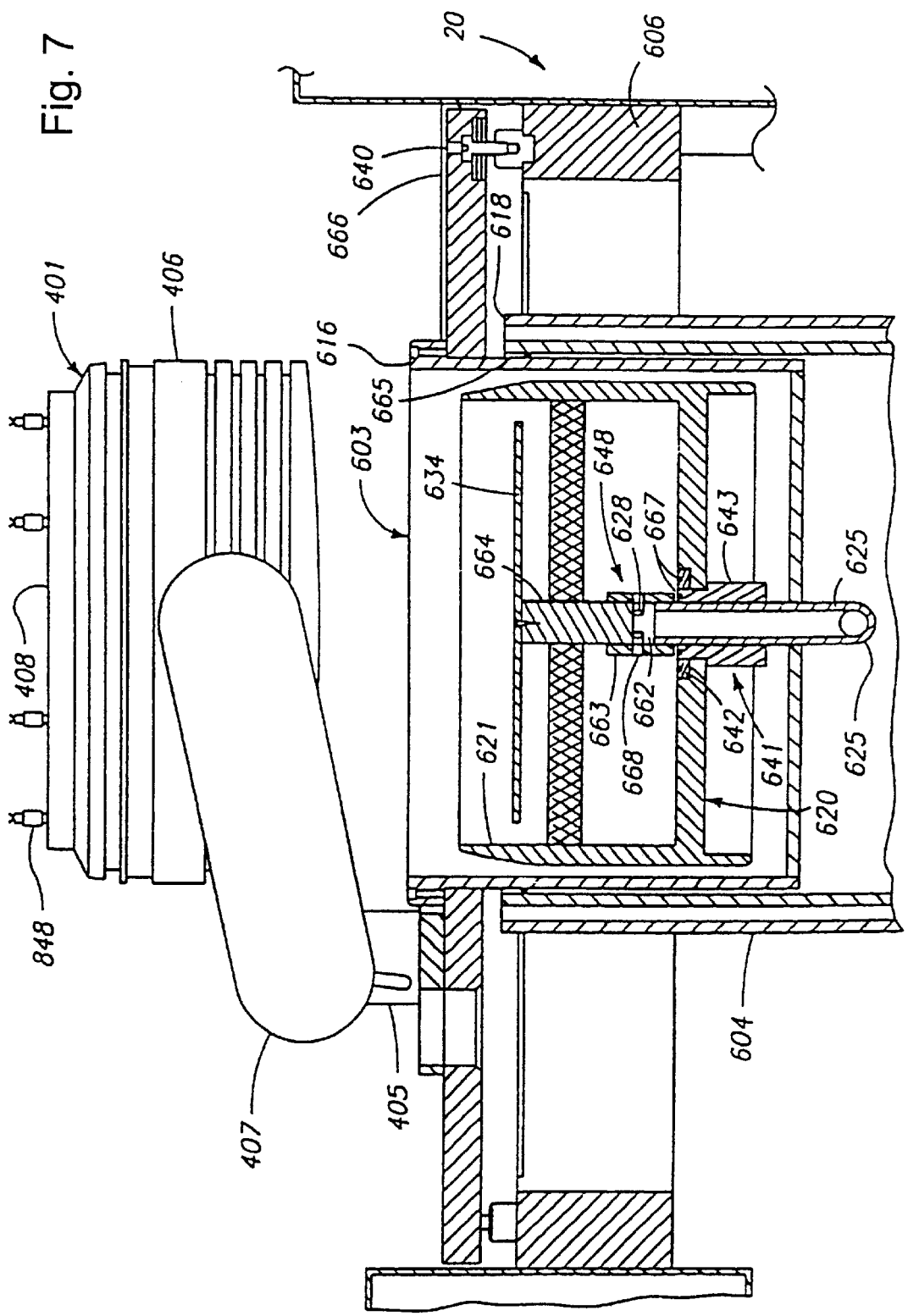
FIG. 7 illustrates one embodiment of a reactor assembly that may be used to implement the disclosed electroplating system.

In the reactor embodiment illustrated in FIGS. 6 and 7, a process bowl or plating chamber 616 having a bowl side 617 and a bowl bottom 619. The process bowl is preferably circular in a horizontal cross section and generally cylindrical in shape although the process bowl may be tapered as well.

A cup assembly 620 is disposed within process bowl 616. Cup assembly 620 includes a fluid cup 621 having a cup side 622 and a cup bottom 623. As with the process bowl, the fluid cup 621 is preferably circular in horizontal cross section and cylindrical in shape, although a tapered cup may be used with a tapered process bowl.

Process fluid is provided to the process bowl 616 through fluid inlet line 625. Fluid inlet line rises through bowl bottom opening 627 and through cup fluid inlet opening 624 and terminates at inlet line end point 631. Fluid outlet openings 628 are disposed within the fluid inlet line 625 in the region between the cup fluid inlet opening 624 and fluid line end point 631. In this way, fluid may flow from the fluid inlet line 625 into the cup 621 by way of the inlet plenum 629.

The cup assembly 620 preferably includes a cup filter 630 which is disposed above the fluid inlet openings and securely fits between the inner cup wall 622 and the fluid inlet line 625 so that fluid must pass through the filter before entering the upper portion of cup 621.

The cup assembly 620 is provided with a metallic anode 634. Anode 634 is secured within the cup assembly by attaching it to the end point 631 of the fluid inlet line. Anode 634 is thus disposed above the cup filter 630 as well as above fluid inlet opening 628. Anode 634 is preferably circular in shape and of a smaller diameter than the inside diameter of cup 621. Anode 634 is secured to the end point 631 of fluid inlet line 625 so as to center the anode 634 within cup 621 creating an annular gap or space 635 between the inner cup wall 622 and the edge of anode 634. Anode 634 should be so placed such as to cause the anode annular opening 635 to be of a constant width throughout its circumference.

The outer cup wall 636 has a smaller diameter than the inside diameter of bowl 616. Cup assembly 620 is positioned within bowl 616 such that a first annular space or process fluid overflow space 632 is formed between bowl side 617 and cup outer wall 636. The cup assembly is more preferably positioned such that the annular fluid overflow space 632 is of a constant width throughout its circumference. Cup assembly 620 is further positioned within bowl 616 such that cup upper edge 633 is below bowl upper edge 637. Cup 621 is preferably height-adjustable with respect to bowl upper edge 637, as more fully described below.

Bowl bottom 619 is configured so as to have a large open area allowing the free transfer of fluid therethrough. In the preferred embodiment, this is achieved by the structure shown in FIG. 6, wherein the process bowl bottom 619 is composed of crossbars 626 which intersect at bowl bottom center plate 639 creating fluid return openings 638. Bowl bottom center plate 639 is provided with bowl bottom opening 627 to allow fluid inlet line 625 to pass therethrough. In the illustrated embodiment, the bowl sides 617 below the reservoir top 618 are also similarly constructed so that bowl sides below reservoir top 618 are composed of 4 rectangular sections which then turn inward towards bowl bottom center plate 639 intersecting thereat. Such a configuration allows for a high degree of fluid flow to pass through the bowl lower portion which is disposed within reservoir 604. Thus, in operation, process fluid is provided through process fluid inlet line 625 and discharges through fluid outlet openings 628 within the lower part of the cup assembly 620. By virtue of cup filter 620, fluid entering the fluid inlet plenum 629 is distributed across the plenum and then flows upward through filter 630 to the bottom of anode 634.

From the top side of filter 630, the process fluid continues to flow in an upward direction by virtue of a continuous supply of process fluid through process inlet line 625. The process fluid flows around the annular gap 635 between the anode 634 and the inner cup wall 622. As the process fluid continues to well up within cup 621, it will eventually reach upper cup edge 633 and will overflow into the overflow annular gap 632 between the outer cup wall 636 and the inner wall of bowl 616.

The overflowing fluid will flow from the overflow gap 632 downward through the gap and back into reservoir 604 where it will be collected for reuse, recycling, or disposal. In this manner, no process fluid return line is required and no elaborate fluid collection system is necessary to collect surplus fluid from the process.

As a further advantage, the location of the cup filter 630 and anode 634 within the cup 621 provides an even distribution of fluid inlet into the cup. The even distribution beneficially assists in providing a quiescent fluid surface at the top of cup 621. In like manner, maintaining a constant distance between the outer wall of cup 636 and the inner wall of bowl 616 in providing the overflow gap 632 will assist in providing an even flow of fluid out of cup 621 and into the reservoir 604. This further beneficially assists in providing the desired quiescence state of the process fluid at the top of cup 621.

The material selection for cup filter 620 will be dictated by the process and other operating needs. Typically, the filter will have the capability of filtering particles as small as 0.1 microns. Likewise, the choice of materials for anode 634 will be dictated by the desired metal to be electroplated onto the workpiece. For example, an anode comprised primarily of copper may be used for electroplating copper onto a semiconductor wafer.

While the reactor has been described particularly for an electroplating process, it can be seen that for a process where a flow of fluid is required but no anode is required removing the anode 634 from the cup assembly 603 will provide a quiescent pool of liquid for the process. In such an arrangement, the end point 631 of the fluid inlet line 625 would be capped or plugged by a cap or plug rather than by the anode 634.

To assist in ensuring that process fluid overflows into the annular gap 632 evenly, the cup upper edge 633 is levelled such that fluid does not flow off of one side of cup 621 faster than on another side. To accomplish this objective, levelers are preferably provided with the process bowl assembly 603.

Turning now to FIG. 7, a representational process bowl assembly is shown in cross section along with a representational workpiece support 401 to illustrate an entire electroplating assembly comprising an auxiliary electrode 1015 (shown in FIG. 6.) Plating chamber assembly 603 is preferably provided with levelers 640 (only one of which is shown in this view) which allow the plating chamber assembly to be leveled relative to the top of reservoir 618. The levelers may comprise jack screws threaded within the edge of module deck plate 666 and in contact with the process module frame 606 so as to elevate the process bowl assembly 603 relative to the process module 20. The process bowl assembly 603 is preferably provided with three such bowl levelers distributed about the bowl periphery. This allows for leveling in both an X and Y axis or what may be generically described as "left and right leveling and front and rear leveling."

Since process bowl assembly 603 is free to move with respect to fluid reservoir 604, when process bowl assembly 603 is fit closely within fluid reservoir 604 as shown in FIG. 6, the process bowl/fluid reservoir junction preferably has a compliant bowl seal 665 disposed therebetween to allow movement of the process bowl 616 with respect to reservoir inner wall 609. Compliant seal 665 further prevents process fluid from passing through the opening between the process bowl and the reservoir wall.

Cup assembly 620 is preferably provided with cup height adjuster 641. The cup height adjuster shown and described herein is comprised of a cup height adjustment jack 643 which is positioned about an external portion of inlet line 625. Cup 621 is secured to cup height adjustment jack 643 with cup lock nut 642. Cup lock nut 642 is used to secure cup 621 in its height position following adjustment. The upper end of cup height adjustment jack 641 is provided with adjustment tool access holes 667 to allow for adjusting of the height of the cup from the top of the bowl rather than the underside. The cup height adjuster 641 may additionally be provided with a fluid seal such as an o-ring (not shown) disposed within the annular space formed between the adjustment jack 643 and the cup bottom 623.

The process bowl assembly 602 is more preferably provided with an additional height adjuster for the anode 634. Anode height adjuster 648 is formed by mounting the anode 634 on the threaded anode post 664. A threaded anode adjustment sleeve 663 is used to connect the threaded upper end of inlet line 625. Anode adjustment sleeve 663 is provided with sleeve openings 668 to allow fluid to pass from fluid outlet openings 628 into the inlet plenum 629. The space between the bottom of anode post 664 and the upper end of fluid inlet line 625, and bounded by the anode adjustment sleeve 663, defines a fluid outlet chamber 662. Fluid outlet chamber is of variable volume as the anode post 664 moves upward and downward with height adjustment of the anode 634.

On the bowl leveler 640 and the height adjusters 641 and 646 described above, it is additionally desirable to provide them with locking mechanisms so that once the desired positioning of the device (i.e., the bowl, the cup, or the anode) is achieved, the position may be maintained by securing the adjusters so that they do not move out of adjustment as a result of vibration or other physical events.

Allowing independent height adjustment of the cup and anode each with respect to the bowl provides a large degree of flexibility in adjusting the process bowl assembly 603 to accommodate a wide selection of processes.

Figure 8:
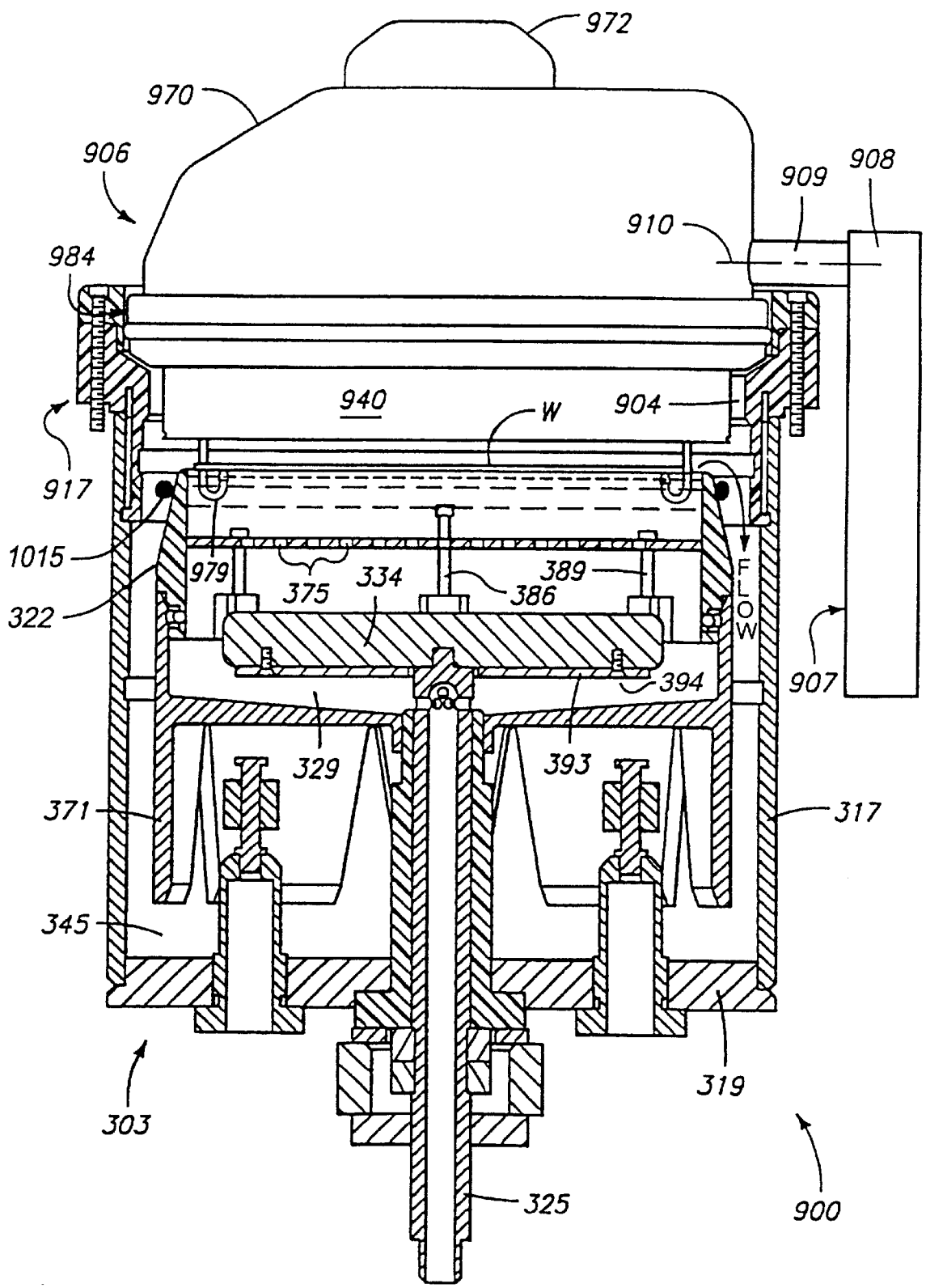
FIG. 8 illustrates a further embodiment of a reactor assembly that may be used to implement the disclosed electroplating system.

A further electroplating processing station that may use one or more external electrodes for in-situ cleaning of the wafer electrode contacts is illustrated in FIG. 8. The two principal parts of processing station 900 are the wafer rotor assembly, shown generally at 906, and the electroplating bowl assembly 303.

FIG. 8 shows the electroplating bowl assembly 303. The bowl assembly comprises a process bowl or plating vessel 316 having an outer bowl side wall 317, bowl bottom 319, and bowl rim assembly 917. The process bowl is preferaoly circular in horizontal cross-section and generally cylindrical in shape although other shapes may be possible.

The bowl assembly 303 includes a cup assembly 320 which is disposed within a process bowl vessel 317. Cup assembly 320 includes a fluid cup portion 321 holding the chemistry for the electroplating process. The cup assembly also has a depending skirt 371 which extends below the cup bottom 323 and may have flutes open therethrough for fluid communication and release of any gas that might collect as the chamber below fills with liquid. The cup is preferably made from polypropylene or other suitable material.

A lower opening in the bottom wall of the cup assembly 320 is connected to a polypropylene riser tube 330 which is adjustable in height relative thereto by a threaded connection. A first end of the riser tube 330 is secured to the rear portion of an anode shield 393 which supports anode 334. A fluid inlet line 325 is disposed within the riser tube 330. Both the riser tube 330 and the fluid inlet line are secured with the processing bowl assembly 303 by a fitting 362. The fitting 362 can accommodate height adjustment of both the riser tube and line 325. As such, the connection between the fitting 362 and the riser tube 330 facilitates vertical adjustment of the anode position. The inlet line 325 is preferably made from a conductive material, such as titanium, and is used to conduct electrical current to the anode 324, as well as supply fluid to the cup.

Process fluid is provided to the cup through fluid inlet line 325 and proceeds therefrom through fluid inlet openings 324. Plating fluid then fills the chamber 904 through opening 324 as supplied by a plating fluid pump (not shown) or other suitable supply.

The upper edge of the cup side wall 322 forms a weir which limits the level of electroplating solution within the cup. This level is chosen so that only the bottom surface of wafer W is contacted by the electroplating solution. Excess solution pours over this top edge surface into an overflow chamber 345. The level of fluid in the chamber 345 is preferably maintained within a desired range for stability of operation by monitoring the fluid level with appropriate sensors and actuators. This can be done using several different outflow configurations. A preferred configuration is to sense a high level condition using an appropriate sensor and then drain fluid through a drain line as controlled by a control valve. It is also possible to use a standpipe arrangement (not illustrated), and such is used as a final overflow protection device in the preferred plating station. More complex level controls are also possible.

The outflow liquid from chamber 345 is preferably returned to a suitable reservoir. The liquid can then be treated with additional plating chemicals or other constituents of the plating or other process liquid and used again.

In preferred use of the apparatus for electroplating, the anode 334 is a consumable anode used in connection with the plating of copper or other metals onto semiconductor materials. The specific anode will vary depending upon the metal being plated and other specifics of the plating liquid being used. A number of different consumable anodes which are commercially available may be used as anode 334.

FIG. 8 also shows a diffusion plate 375 provided above the anode 334 for providing a more even distribution of the fluid plating bath across the wafer W. Fluid passages are provided over all or a portion of the diffusion plate 375 to allow fluid communication therethrough. The height of the diffusion plate is adjustable using diffuser height adjustment mechanisms 386.

The anode shield 393 is secured to the underside of the consumable anode 334 using anode shield fasteners 394 to prevent direct impingement by the plating solution as the solution passes into the processing chamber 904. The anode shield 393 and anode shield fasteners 394 are preferably made from a dielectric material, such as polyvinylidene fluoride or polypropylene. The anode shield is advantageously about 2–5 millimeters thick, more preferably about 3 millimeters thick.

The anode shield serves to electrically isolate and physically protect the back side of the anode. It also reduces the consumption of organic plating liquid additives. Although the exact mechanism may not be known at this time, the anode shield is believed to prevent disruption of certain materials which develop over time on the back side of the anode. If the anode is left unshielded, the organic chemical plating additives are consumed at a significantly greater rate. With the shield in place, these additives are not consumed as quickly.

The wafer rotor assembly 906 holds a wafer W for rotation within the processing chamber 904. The wafer rotor assembly 906 includes a rotor assembly 984 having a plurality of wafer-engaging fingers 979 that hold the wafer against features of the rotor. Fingers 979 are preferably adapted to conduct current between the wafer and a plating electrical power supply and may be constructed in accordance with various configurations to act as current thieves.

The various components used to spin the rotor assembly 984 are disposed in a fixed housing 970. The fixed housing is connected to a horizontally extending arm 909 that, in turn, is connected to a vertically extending arm. Together, the arms 908 and 909 allow the assembly 906 to be lifted and rotated from engagement with the bowl assembly to thereby present the wafer to the wafer conveying assembly 60 for transfer to a subsequent processing station.

The workpiece support processing head holds a wafer W for rotation within the processing chamber 904. A rotor assembly 984 has a plurality of workpiece-engaging fingers 979 that hold the wafer against features of the rotor. Fingers 979 are also preferably adapted to conduct current between the wafer and a plating electrical power supply (not shown).

FIG. 8 also shows auxiliary electrode 1015 disposed annularly around the cup sidewall 322. In a cleaning operation, the plating solution flows (as indicated by "FLOW") over the weir formed by cup sidewall 322 and over auxiliary electrode 1015 into the area between walls 317 and 322.

The workpiece support assembly 901 includes a processing head 906 which is supported by an head operator 907. Head operator 907 includes an upper portion 908 which is adjustable in elevation to allow height adjustment of the processing head. Head operator 907 also has a head connection shaft 909 which is operable to pivot about a horizontal pivot axis 910. Pivotal action of the processing head using operator 907 allows the processing head to be placed in an open or face-up position (not shown) for loading and unloading wafer W. FIG. 7 shows the processing head pivoted into a face-down position in preparation for processing.

A variety of suitable head operators which provide both elevational and horizontal pivoting action are possible for use in this system. The preferred operators are also fitted with positional encoders (not shown) which indicate both the elevation of the processing head and its angular position as pivoted about horizontal head pivot axis 910.

Figure 9:
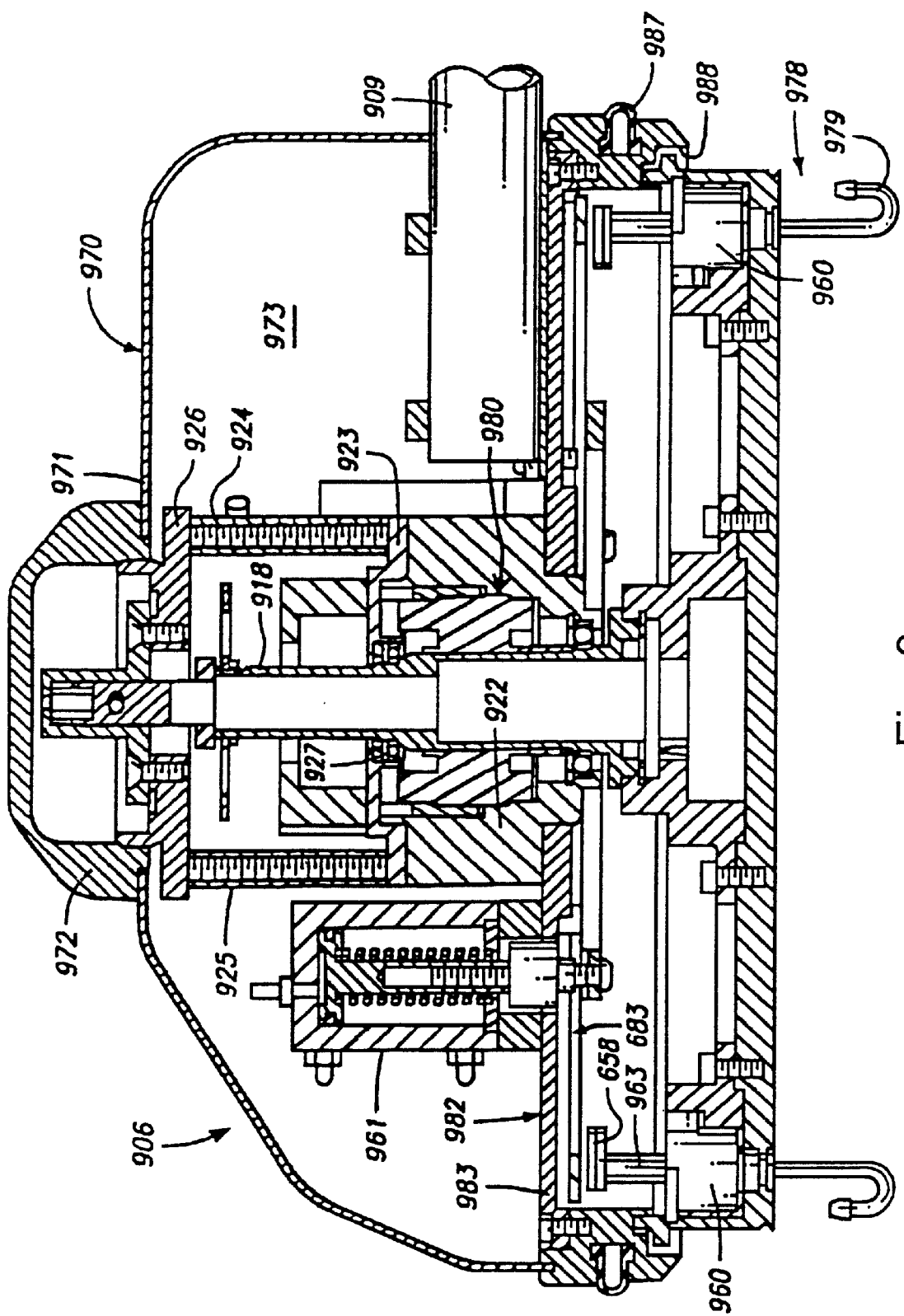
FIG. 9 illustrates one embodiment of a wafer support/spin assembly that may be used to implement electroplating system.

FIGS. 8 and 9 show additional details of the preferred construction of processing head 906. The processing head includes a main part which moves with and is relatively stationary with respect to the pivot shaft 909. The main part supports a rotating assembly which will be described in greater detail below.

The main part includes a processing head housing 970 and processing head frame 982. The processing head frame 982 includes a door plate 983. A door ring member 984 is joined to plate 983 using suitable fasteners to provide a door assembly which serve as the principal parts covering the upper opening of the processing bowl when the processing head is mated with the bowl.

The processing head frame also includes a frame-pivot shaft connection 985 which includes two mounting rings which receive and securely connect with the processing head pivot shaft 909. FIG. 9 shows that the pivot shaft connection mounting rings are made in two parts and secured by fasteners (not shown). The pivot shaft connection base 935 is secured to the door plate 983 using fasteners.

Processing head 906 is generally round in shape when viewed in plan view. The processing head main part includes a housing 970 which has a first housing part 971 and a second housing part or housing cap 972. The processing head housing 970 encloses a main part enclosure which surrounds a processing head main part mechanism chamber 973. Chamber 973 is used to house additional processing head components, such as the spin motor, the finger actuators, and related service lines, such as discussed more fully below.

The upper surface of the door ring member 984 is provided with a groove which receives the lower edge of the first housing piece 971. The outer periphery of the door ring member also advantageously includes a peripheral groove 986 which mounts an inflatable door seal 987. Seal 987 seals with portions of the processing bowl to form a more fluid-tight processing chamber therewithin.

The lower surface of the door ring member 984 is preferably provided with an annular rotor receiving groove 988 which receives top peripheral portions of the rotor therein in close proximity. This construction allows a gas purge (not shown) to be applied between the door and rotor to help prevent processing vapors from migrating behind the rotor and into to the various mechanisms present in the main part of the processing head. The periphery of the door ring member is further provided with a chamfered lower edge to facilitate mating with the processing bowl.

The processing head also includes a moving assembly in the form of a workpiece holder 978. The workpiece holder includes fingers 979 for holding a semiconductor workpiece. In the illustrated embodiment, an actuator 961 is used to drive a drive plate 683 against an upper plate 658 of finger actuators 960. When actuated in this manner, finger actuators 960 cause fingers 979 to rotate and disengage from the wafer. Disengagement between plate 683 and plate 658 causes the actuators 960 to drive and rotate fingers 979 into engagement with the wafer. The electrodes may comprise any suitable metal or combination of metals for electrode purposes, i.e. they must be compatible with the reaction conditions and conductive. Such metals include copper, platinum, titanium or platinized metals.

The processing head main part also includes a workpiece holder drive which moves the workpiece holder relative to the main part of the processing head. The preferred action is for the workpiece holder drive to be in the form of a rotor drive which rotates the workpiece holder. The rotor drive can be an electric motor, pneumatic motor or other suitable drive. As shown, the processing head includes an electric workpiece spin motor 980.

The drive motor 980 has stator armatures 916 which drive motor shaft 918 in rotational movement. Drive motor 980 is supported by bottom motor bearing 921 in bottom motor housing 922. Bottom motor housing 922 is secured to the main part of the processing head at a central opening in the door plate 983. Motor 980 is also held in place by a top motor housing 923. Drive motor 980 is rotationally isolated from top motor housing 923 by a top motor bearing 927, which is disposed between the spin motor shaft 918 and the top motor housing. Both motor housings are secured to the processing head frame 982 using fasteners 924 which extend down through the motor housings and into the door plate 983. The fasteners 924 also extend upwardly through frame extensions 925. Frame extensions 925 support a top frame piece 926. Cap 972 is screwed onto piece 926 at mating threads along the lower interior portion of the cap.

The drive motor is preferably an electric motor provided with a supply of electricity via wiring run through pivot shaft 909 or otherwise extending to the processing head.

The wafer support head 906 may be used to rotate the wafer contact electrodes during in-situ cleaning thereof. In such instances, the electrode may rotate at an angular velocity in the approximate range from about 1 revolution per minute to about 300 revolutions per minute, or alternatively from about 10 revolutions per minute to about 100 revolutions per minute. The direction of the rotation may be changed at least once during a cleaning cycle, or alternatively in the approximate range from about every 10 seconds to about every 1 minute.

To provide process fluid to the process bowl assembly in the electroplating module, the module is advantageously provided with fluid transfer equipment. The fluid transfer equipment is provided to draw process fluid from a reservoir, supply it to the process bowl assembly, and return it to a common collection point. The equipment may include an immersible pump which is mounted in a reservoir. The reaction chamber may be provided with such a pump, which further comprises a fluid suction or pump suction hitch that draws process fluid from the reservoir. The immersible pump pumps fluid by pump suction into the pump body and out through the fluid discharge or pump discharge. The immersible pump is preferably driven by an electric pump motor.

In alternate embodiments of the present system, a submersible pump may be employed. An immersible pump has an advantage in that it may be easily removed for servicing and the like. In yet another embodiment, individual pumps for each of the process bowl assemblies may be deployed or, process bowls assemblies may share a set of common pumps. Each such pump would have a process fluid inlet suction and a process fluid discharge.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A system for electroplating a semiconductor wafer comprising:
    a first electrode in electrical contact with the semiconductor wafer, the first electrode and the semiconductor wafer forming a cathode during electroplating of the semiconductor wafer;
    a second electrode forming an anode during electroplating of the semiconductor wafer;
    a reaction container defining a reaction chamber, the reaction chamber comprising an electrically conductive plating solution, at least a portion of each of the first electrode, the second electrode, and the semiconductor wafer contacting the plating solution during electroplating of the semiconductor wafer;
    an auxiliary electrode disposed exterior to the reaction chamber and positioned for contact with plating solution exiting the reaction chamber during cleaning of the first electrode to thereby provide an electrically conductive path between the auxiliary electrode and the first electrode;
    a power supply system connected to supply plating power to the first and second electrodes during electroplating of the semiconductor wafer, the power supply system further connected to render the first electrode an anode and the auxiliary electrode a cathode during cleaning of the first electrode.

2. A system as claimed in claim 1, wherein the second electrode is disposed substantially entirely in the plating solution of the reaction chamber and the first electrode comprises at least one conductive finger which supports a semiconductor wafer as the semiconductor wafer, the at least one conductive finger being positioned to support the semiconductor wafer so that only one side of the semiconductor wafer contacts the surface of the plating solution in the reaction chamber during electroplating thereof.

3. A system as claimed in claim 1, wherein the auxiliary electrode is disposed in an outlet tube that accepts the plating solution after exiting the reaction chamber.

4. A system as claimed in claim 3 and further comprising a control valve disposed to control plating solution flow through the outlet tube as it flows toward the auxiliary electrode.

5. A system as claimed in claim 3, further comprising a particulate filter disposed to filter residue from the plating solution after exiting the plating bath.

6. A system as claimed in claim 1, and further comprising a reservoir container, the reaction container disposed at least partially in the reservoir container, plating solution exiting the reaction chamber flowing into the reservoir container.

7. A system as claimed in claim 6 wherein the auxiliary electrode is disposed in the reservoir container.

8. A system as claimed in claim 6, wherein the auxiliary electrode is disposed in an outlet tube that accepts plating solution exiting the reservoir container.

9. A system as claimed in claim 8 and further comprising a control valve disposed to control plating solution flow through the outlet tube as it flows toward the auxiliary electrode.

10. A system as claimed in claim 6 wherein the reservoir container is attached to a plating solution outlet tube comprising a particulate filter.

11. A system as claimed in claim 1 wherein the second electrode is a consumable anode and wherein the system further comprises an anode shield positioned to shield the anode from direct or oblique impingement by flowing plating solution.

12. The system of claim 11 wherein the anode shield is made of a dielectric material.

13. A method for operating a system used to electroplate a semiconductor wafer, the system comprising a first electrode for contacting the semiconductor wafer, a second electrode functioning as an anode during electroplating of the semiconductor wafer, an electrically conductive plating solution disposed in a reaction chamber, and an auxiliary electrode disposed exterior to the reaction chamber and a fluid flow path of plating solution exiting the reaction chamber, the semiconductor wafer and first and second electrodes being in contact with the plating solution in the reaction chamber during electroplating of the semiconductor wafer, the method comprising the steps of:

providing a flow of plating solution from the reaction chamber to the auxiliary electrode to create an electrically conductive path between the first electrode and the auxiliary electrode;

applying electrical power between the first electrode and the auxiliary electrode in which the auxiliary electrode functions as a cathode and the first electrode functions as an anode to thereby remove at least a portion of a metal electroplated onto the first electrode during a prior semiconductor wafer electroplating operation.

14. The method according to claim 13 and further comprising the step of passing the plating solution containing removed plated deposits through a particulate filter to define a filtered plating solution.

15. The method according to claim 14, further comprising returning the filtered plating solution to the reaction chamber.

* * * * *

UNITED STATES PATENT AND TRADEMARK OFFICE
CERTIFICATE OF CORRECTION

PATENT NO. : 6,270,647 B1
DATED : August 7, 2001
INVENTOR(S) : Graham et al.

It is certified that error appears in the above-identified patent and that said Letters Patent is hereby corrected as shown below:

<u>Column 10,</u>
Line 39, "preferaoly" should be -- preferably --;

Signed and Sealed this

Twenty-first Day of May, 2002

Attest:

Attesting Officer

JAMES E. ROGAN
Director of the United States Patent and Trademark Office